United States Patent
Chu

(10) Patent No.: US 11,329,579 B2
(45) Date of Patent: May 10, 2022

(54) MOTOR CONTROLLER

(71) Applicant: Global Mixed-mode Technology Inc., Hsin-Chu (TW)

(72) Inventor: Chien-Lun Chu, Hsinchu County (TW)

(73) Assignee: Global Mixed-mode Technology Inc., Hsin-Chu (TW)

( * ) Notice: Subject to any disclaimer, the term of this patent is extended or adjusted under 35 U.S.C. 154(b) by 62 days.

(21) Appl. No.: 17/002,794

(22) Filed: Aug. 26, 2020

(65) Prior Publication Data

US 2022/0069746 A1     Mar. 3, 2022

(51) Int. Cl.
| | | |
|---|---|---|
| H02P 6/28 | (2016.01) | |
| H02P 6/10 | (2006.01) | |
| H02P 7/03 | (2016.01) | |
| G01R 19/165 | (2006.01) | |
| H02P 6/16 | (2016.01) | |
| G01R 33/07 | (2006.01) | |
| H02P 23/14 | (2006.01) | |

(52) U.S. Cl.
CPC .......... *H02P 6/10* (2013.01); *G01R 19/16538* (2013.01); *G01R 33/07* (2013.01); *H02P 6/16* (2013.01); *H02P 7/04* (2016.02); *H02P 23/14* (2013.01)

(58) Field of Classification Search
CPC ...... H02P 6/10; H02P 7/04; H02P 6/16; H02P 23/14; G01R 19/16538; G01R 33/07
See application file for complete search history.

(56) References Cited

U.S. PATENT DOCUMENTS

| | | | | |
|---|---|---|---|---|
| 5,798,623 A | * | 8/1998 | El-Sadi | H02P 6/06 318/400.17 |
| 2002/0153787 A1 | * | 10/2002 | Hollenbeck | H02P 6/26 310/68 R |
| 2006/0197396 A1 | | 9/2006 | Pollock | |
| 2007/0189739 A1 | * | 8/2007 | Dufner | H02P 6/28 388/801 |

FOREIGN PATENT DOCUMENTS

| | | |
|---|---|---|
| CN | 101485077 A | 7/2009 |
| CN | 102629813 A | 8/2012 |
| CN | 103219934 A | 7/2013 |
| TW | 201601422 A | 1/2016 |

\* cited by examiner

*Primary Examiner* — Cortez M Cook
(74) *Attorney, Agent, or Firm* — Winston Hsu

(57) ABSTRACT

A motor controller is configured to reduce the motor noise. The motor controller is used for driving a motor, where the motor has a motor coil and a rotor. The rotor is divided into four pole regions N1, S1, N2, and S2 to switch phases. The four pole regions have a manufacturing tolerance and the pole region N1 has a time interval T1. The motor controller comprises a switch circuit, a control unit, a phase detecting unit, and a current detecting unit. The switch circuit is configured to supply a driving current to the motor coil. Based on the manufacturing tolerance and the time interval T1, the time point to detect the driving current is set to be a proportional time PT before the phase switching, where PT/T1 is greater than the manufacturing tolerance.

13 Claims, 3 Drawing Sheets

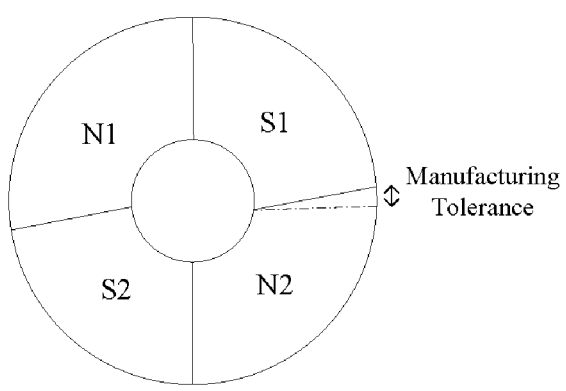
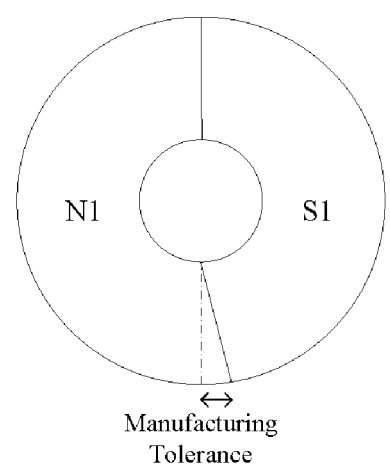
FIG. 2A                    FIG. 2B

MOTOR CONTROLLER

BACKGROUND OF THE INVENTION

1. Field of the Invention

The present invention relates to a motor controller, and more particularly, to a motor controller which is capable of reducing the motor noise.

2. Description of the Prior Art

Generally, there still remains the current flowing through the motor coil due to the asymmetrical pole regions at the time point of phase switching, which results in a mechanical noise when the motor rotates. A prior-art method detects the current flowing through the motor coil at the time point of phase switching, so as to determine if the timing sequence of a plurality of driving signals needs to be adjusted or not in the next period, where the driving signals are configured to control a driving circuit. The driving circuit may be an H-bridge circuit. However, the rotor of the motor may be divided into a plurality of pole regions. When the sizes of the plurality of the pole regions differ due to a manufacturing tolerance, the prior-art method may result in the motor noise because there still remains the current flowing through the motor coil at the time point of phase switching.

Thus, what is needed is the motor controller which is capable of reducing the mechanical noise.

SUMMARY OF THE INVENTION

According to the present invention, a motor controller which is capable of reducing the motor noise is provided. The motor controller is used for driving a motor, where the motor has a motor coil and a rotor. The rotor is divided into four pole regions N1, S1, N2, and S2 to switch phases. The four pole regions have a manufacturing tolerance and the pole region N1 has a time interval T1. The motor controller comprises a switch circuit, a control unit, a phase detecting unit, and a current detecting unit. The switch circuit is configured to supply a driving current to the motor coil. Based on the manufacturing tolerance and the time interval T1, the time point to detect the driving current is set to be a proportional time PT before the phase switching, where PT/T1 is greater than the manufacturing tolerance. Then the driving current can be reduced at the time point of subsequent phase switching by an early control mechanism, such that the motor noise due to the manufacturing tolerance can be reduced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and accompanying drawings, wherein:

FIG. 2A is a schematic diagram of a rotor according to one embodiment of the present invention;

FIG. 2B is a schematic diagram of another rotor according to another embodiment of the present invention.

DETAILED DESCRIPTION

Preferred embodiments according to the present invention will be described in detail with reference to the drawings.

Figure 1:
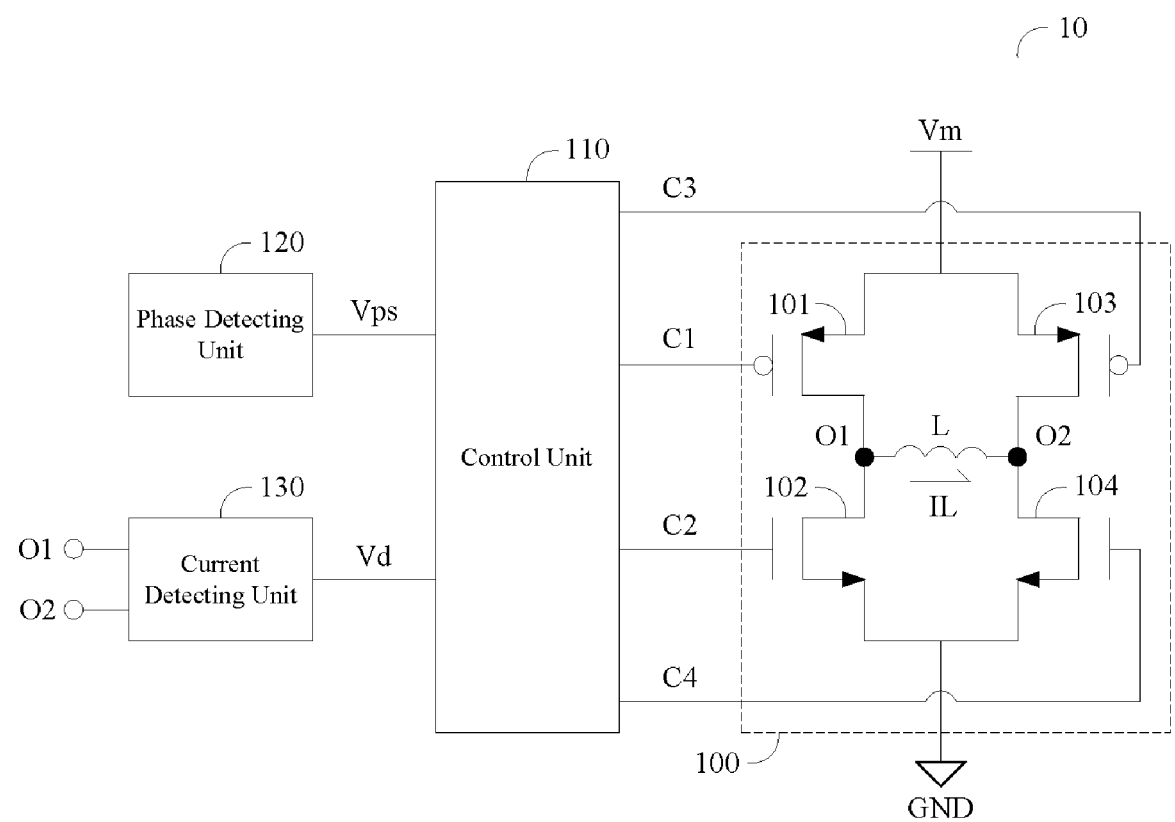
FIG. 1 is a circuit diagram showing a motor controller according to one embodiment of the present invention.

FIG. 1 is a circuit diagram showing a motor controller 10 according to one embodiment of the present invention. The motor controller 10 is used for driving a motor, where the motor has a motor coil L and a rotor. FIG. 2A is the schematic diagram of the rotor according to one embodiment of the present invention. The rotor is divided into four pole regions N1, S, N2, and S2 to switch phases, but the present invention is not limited to the number of the pole regions. In an ideal case, the size of each of the four pole regions should be equal to a quarter of the rotor. As shown in FIG. 2A, practically the size of each of the four pole regions is not equal to a quarter of the rotor due to a manufacturing error. Thus, when the rotor is divided into two pole regions, four pole regions, or more than four pole regions, in each case it is capable of defining a manufacturing tolerance to indicate a permissible limit of variation. FIG. 2B is a schematic diagram of another rotor according to another embodiment of the present invention. When the rotor is divided into two pole regions N1 and S1 to switch phases, it is also capable of defining another manufacturing tolerance.

As shown in FIG. 1, the motor coil L has a first terminal O1 and a second terminal O2. The motor controller 10 comprises a switch circuit 100, a control unit 110, a phase detecting unit 120, and a current detecting unit 130. The switch circuit 100 includes a first transistor 101, a second transistor 102, a third transistor 103, and a fourth transistor 104 for supplying a driving current IL to the motor coil L. The first transistor 101 is coupled to a voltage source Vm and the first terminal O1 while the second transistor 102 is coupled to the first terminal O1 and a ground GND. The third transistor 103 is coupled to the voltage source Vm and the second terminal O2 while the fourth transistor 104 is coupled to the second terminal O2 and the ground GND. The first transistor 101, the second transistor 102, the third transistor 103, and the fourth transistor 104 may be respectively a p-type MOSFET or an n-type MOSFET. As shown in FIG. 1, each of the first transistor 101 and the third transistor 103 may be a p-type MOSFET, while each of the second transistor 102 and the fourth transistor 104 may be an n-type MOSFET.

The control unit 110 generates a first control signal C1, a second control signal C2, a third control signal C3, and a fourth control signal C4 so as to respectively control the ON/OFF states of the first transistor 201, the second transistor 202, the third transistor 203, and the fourth transistor 204. The control unit 110 operates alternatively in a first driving mode and a second driving mode, so as to supply the electric energy to the motor. In the first driving mode, the control unit 110 turns on the first transistor 101 and the fourth transistor 104 by controlling the first control signal C1 and the fourth control signal C4. At this moment the current flows sequentially from the voltage source Vm to the first transistor 101, the motor coil L, and the fourth transistor 104 for supplying the electric energy to the motor. In the second driving mode, the control unit 110 turns on the second transistor 102 and the third transistor 103 by controlling the second control signal C2 and the third control signal C3. At this moment the current flows sequentially from the voltage source Vm to the third transistor 103, the motor coil L, and the second transistor 102 for supplying the electric energy to the motor. By operating alternatively between the first driving mode and the second driving mode, the motor can be rotated normally as a result.

The phase detecting unit 120 generates a phase signal Vps to the control unit 110, where the phase detecting unit 120 may be a Hall sensing device or a back-electromotive force detecting circuit. For example, the Hall sensing device may be configured to detect the position change of the pole regions N1, S1, N2, and S2 in the rotor, so as to generate the phase signal Vps. Thus, the current pole region of the rotor can be obtained by the phase signal Vps. The current detecting unit 130 is coupled to the first terminal O1 and the second terminal O2, so as to detect the driving current IL and generate a detecting signal Vd to the control unit 110.

Figure 3:
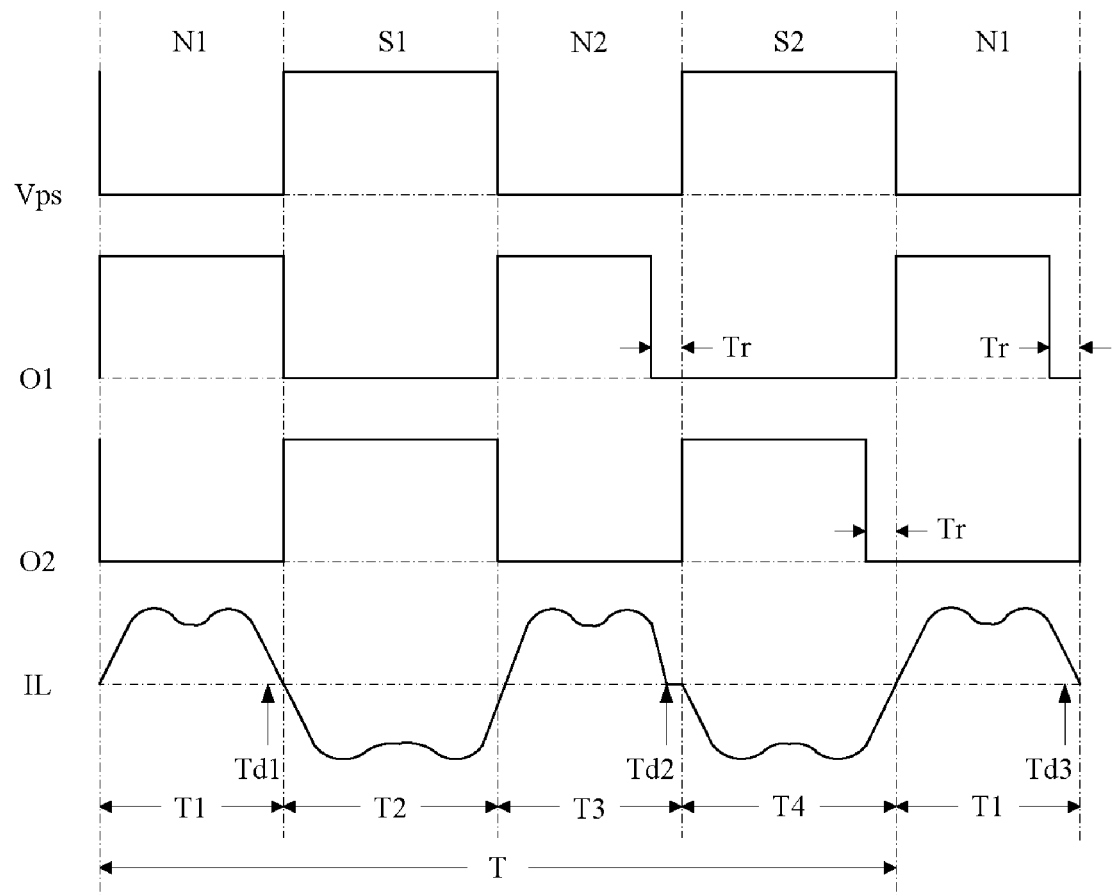
FIG. 3 is a timing chart according to one embodiment of the present invention.

FIG. 3 is a timing chart according to one embodiment of the present invention. The pole region N1 has a time interval T1. The pole region S1 has a time interval T2. The pole region N2 has a time interval T3. The pole region S2 has a time interval T4. The pole regions N1, S1, N2, and S2 have a period T, where T=T1+T2+T3+T4. A time point Td1 to detect the driving current IL is determined based on the manufacturing tolerance, where Td1<T1. According to one embodiment of the present invention, (T1−Td1)/T1 may be designed to be greater than the manufacturing tolerance. Therefore, when the manufacturing tolerance is equal to N %, the time point Td1 can be set to be less than (1−N %)×T1, where N>0. When the current detecting unit 130 detects that the driving current IL is greater than 0 at the time point Td1, the control unit 110 may control the switch circuit 100 at a reference time Tr before subsequent phase switching, so as to reduce the driving current IL at the time point of phase switching. That is, an early control mechanism is performed by the control unit 110. More specifically, if the current detecting unit 130 detects that the driving current IL is greater than 0 at the time point Td1, the control unit 110 may change the voltage of the first terminal O1 from a high level to a low level by controlling the switch circuit 100 at the time point (T1+T2+T3−Tr), and the control unit 110 may change the voltage of the second terminal O2 from the high level to the low level by controlling the switch circuit 100 at the time point (T1+T2+T3+T4−Tr). Besides, the control unit 110 may control the switch circuit 100 at the reference time Tr before phase switching from the next period. In other words, if the current detecting unit 130 detects that the driving current IL is greater than 0 at the time point Td1, the control unit 110 may change the voltage of the first terminal O1 from the high level to the low level by controlling the switch circuit 100 at the time point (T+T1−Tr).

According to various design considerations, it is capable of choosing a next time point Td2 or Td3 to detect the driving current IL, where the time point Td2 may be set to be less than T1+T2+(1−N %)×T3 while the time point Td3 may be set to be less than T+(1−N %)×T1. If the driving current IL is still greater than 0 at the next time point Td2 or Td3, the early control mechanism may be performed again by the control unit 110. When the current detecting unit 130 detects that the driving current IL is equal to 0 finally, it is capable of reducing the motor noise due to the manufacturing tolerance.

The motor controller 10 of the present invention can be applied to a single-phase or polyphase configuration. Also, the motor controller 10 can be applied to an inductive actuator, such as a brushless motor, a DC motor, a voice coil motor, or an electromagnetic actuator. Based on the manufacturing tolerance and the time interval T1, the time point to detect the driving current is set to be a proportional time PT before the phase switching, where PT/T1 is greater than the manufacturing tolerance. Then the driving current IL can be reduced at the time point of subsequent phase switching by the early control mechanism, such that the motor noise due to the manufacturing tolerance can be reduced.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motor controller configured to drive a motor, wherein the motor has a motor coil and a rotor, the rotor has a first pole region and a second pole region to switch phases, the first pole region and the second pole region have a manufacturing tolerance, the first pole region has a first time interval T1, and the motor controller comprises:
  a switch circuit, configured to supply a driving current to the motor coil;
  a control unit, configured to control the switch circuit;
  a phase detecting unit, configured to generate a phase signal to the control unit; and
  a current detecting unit, configured to detect the driving current and generate a detecting signal to the control unit, wherein a first time point Td1 to detect the driving current is determined based on the manufacturing tolerance, where Td1<T1, and when the manufacturing tolerance is equal to N %, Td1 is less than (1−N %)×T1, where N>0.

2. The motor controller of claim 1, wherein the motor controller can be applied to a single-phase or polyphase configuration.

3. A motor controller configured to drive a motor, wherein the motor has a motor coil and a rotor, the rotor has a first pole region, a second pole region, a third pole region, and a fourth pole region to switch phases, the first pole region, the second pole region, the third pole region, and the fourth pole region have a manufacturing tolerance, the first pole region has a first time interval T1, the second pole region has a second time interval T2, the third pole region has a third time interval T3, the fourth pole region has a fourth time interval T4, the motor coil has a first terminal and a second terminal, and the motor controller comprises:
  a switch circuit, configured to supply a driving current to the motor coil;
  a control unit, configured to control the switch circuit;
  a phase detecting unit, configured to generate a phase signal to the control unit; and
  a current detecting unit, configured to detect the driving current and generate a detecting signal to the control unit, wherein a first time point Td1 to detect the driving current is determined based on the manufacturing tolerance, where Td1<T1, and when the manufacturing tolerance is equal to N %, Td1 is less than (1−N %)×T1, where N>0.

4. The motor controller of claim 3, wherein a second time point Td2 to detect the driving current is determined based on the manufacturing tolerance and Td2 is less than (T1+T2+(1−N %)×T3).

5. The motor controller of claim 3, wherein a third time point Td3 to detect the driving current is determined based on the manufacturing tolerance and Td3 is less than (T1+T2+T3+T4+(1−N %)×T1).

6. The motor controller of claim 3, wherein if the current detecting unit detects that the driving current is greater than 0 at the first time point Td1, the control unit changes a voltage of the first terminal from a high level to a low level by controlling the switch circuit at a time point (T1+T2+T3−Tr), where Tr is a reference time.

7. The motor controller of claim 6, wherein if the current detecting unit detects that the driving current is greater than 0 at the first time point Td1, the control unit changes a voltage of the second terminal from the high level to the low level by controlling the switch circuit at a time point (T1+T2+T3+T4−Tr).

8. The motor controller of claim 3, wherein if the current detecting unit detects that the driving current is greater than 0 at the first time point Td1, the control unit changes a voltage of the first terminal from a high level to a low level by controlling the switch circuit at a time point (T1+T2+T3+T4+T1−Tr), where Tr is a reference time.

9. The motor controller of claim 3, wherein the switch circuit comprises:
 a first transistor, coupled to a voltage source and the first terminal;
 a second transistor, coupled to the first terminal and a ground;
 a third transistor, coupled to the voltage source and the second terminal; and
 a fourth transistor, coupled to the second terminal and the ground.

10. The motor controller of claim 9, wherein each of the first transistor and the third transistor is a p-type MOSFET, and each of the second transistor and the fourth transistor is an n-type MOSFET.

11. The motor controller of claim 3, wherein the current detecting unit is coupled to the first terminal and the second terminal.

12. The motor controller of claim 3, wherein the phase detecting unit is a Hall sensing device.

13. The motor controller of claim 3, wherein the motor controller is applied to a single-phase or polyphase configuration.

* * * * *